US010312406B2

United States Patent
Chou et al.

(10) Patent No.: US 10,312,406 B2
(45) Date of Patent: Jun. 4, 2019

(54) METHOD OF FORMING GIGANTIC QUANTUM DOTS

(71) Applicant: Unique Materials Co., Ltd., Taipei (TW)

(72) Inventors: Pi-Tai Chou, Taipei (TW); Shang-Wei Chou, Taipei (TW); Yu-Min Lin, Taipei (TW); Chin-Cheng Chiang, Taipei (TW); Chia-Chun Hsieh, Taipei (TW)

(73) Assignee: Unique Materials Co., Ltd., Taipei (TW)

( * ) Notice: Subject to any disclaimer, the term of this patent is extended or adjusted under 35 U.S.C. 154(b) by 0 days.

(21) Appl. No.: 15/886,832

(22) Filed: Feb. 2, 2018

(65) Prior Publication Data

US 2018/0342645 A1    Nov. 29, 2018

Related U.S. Application Data

(62) Division of application No. 15/607,253, filed on May 26, 2017, now Pat. No. 10,096,743.

(51) Int. Cl.

| H01L 29/06 | (2006.01) |
|---|---|
| H01L 33/06 | (2010.01) |
| H01L 33/28 | (2010.01) |
| H01L 33/00 | (2010.01) |

(52) U.S. Cl.
CPC .......... *H01L 33/06* (2013.01); *H01L 33/0029* (2013.01); *H01L 33/0083* (2013.01); *H01L 33/28* (2013.01)

(58) Field of Classification Search
CPC . H01L 33/06; H01L 33/0029; H01L 33/0083; H01L 33/28
USPC .......................................................... 257/13
See application file for complete search history.

(56) References Cited

U.S. PATENT DOCUMENTS

| 2008/0138514 A1* | 6/2008 | Jang ......................... B01J 13/02 427/213.3 |
|---|---|---|
| 2018/0175254 A1* | 6/2018 | Chung ..................... B32B 5/16 |

* cited by examiner

*Primary Examiner* — Tu-Tu V Ho
(74) *Attorney, Agent, or Firm* — JCIPRNET

(57) ABSTRACT

Provided is a method of forming gigantic quantum dots including following steps. A first precursor by mixing zinc acetate $(Zn(ac)_2)$, cadmium oxide (CdO), a surfactant, and a solvent together and then performing a first heat treatment is provided. The first precursor includes Zn-complex having the surfactant and Cd-complex having the surfactant. A second precursor containing elements S and Se and trioctylphosphine (TOP) is added into the first precursor to form a reaction mixture. A second heat treatment is performed on the reaction mixture and then cooling the reaction mixture to form the gigantic quantum dots in the reaction mixture.

13 Claims, 5 Drawing Sheets

METHOD OF FORMING GIGANTIC QUANTUM DOTS

CROSS REFERENCE TO RELATED APPLICATION

This application is a divisional application of and claims the priority benefit of U.S. application Ser. No. 15/607,253, filed on May 26, 2017, now pending. The entirety of the above-mentioned patent application is hereby incorporated by reference herein and made a part of specification.

BACKGROUND OF THE INVENTION

1. Field of the Invention

The present invention generally relates to a method of forming quantum dots, in particular, to a method of forming gigantic quantum dots.

2. Description of Related Art

Semiconductor nanoparticles, also referred to as quantum dots (QDs), are semiconductor materials with a nano-sized (generally <100 nm) dimensions and a crystalline structure, and can include from hundreds to thousands of atoms. Since QDs are very small, they have a large surface area per unit volume, and also exhibit quantum confinement effects. Accordingly, they have unique physicochemical characteristics based on their size, that differ from inherent characteristics of corresponding bulk semiconductor materials.

Since optoelectronic properties of QDs may be controlled by adjusting their core size, the QDs remain the object of active research as applied to, for example, display devices. QDs, when used in a display device however, further require increased stability, luminous efficacy, color purity, lifetime, and other such properties.

Currently, the biggest challenge for QDs application is long-term stability. External factors, such as intense light, high temperature, moisture, volatile substances and oxidants, can cause irreversible decay of QDs emission intensity. Increased QD size, mainly shell thickness, can increase stability, but this requires either additional multiple reaction steps to form extra outer shell after the original QDs synthesis or long reaction time, both often lead to higher cost and lower emission quantum yield. It is also difficult to adjust QDs emission peak wavelength (i.e., color) via controlling reaction time and changing the ratio between core and shell precursor materials in the reaction.

SUMMARY OF THE INVENTION

The invention provides a method of forming gigantic quantum dots being capable of fine-tuning the gigantic quantum dots emission peak wavelength by changing the amount of a surfactant.

A method of forming gigantic quantum dots include following steps. A first precursor by mixing zinc acetate ($Zn(ac)_2$), cadmium oxide (CdO), a surfactant, and a solvent together and then performing a first heat treatment is provided. The first precursor includes Zn-complex having the surfactant and Cd-complex having the surfactant. A second precursor containing elements S and Se and trioctylphosphine (TOP) is added into the first precursor to form a reaction mixture. A second heat treatment is performed on the reaction mixture and then cooling the reaction mixture to form the gigantic quantum dots in the reaction mixture.

In an embodiment of the invention, the surfactant includes oleic acid, trioctylphosphine (TOP) or a combination thereof. The solvent includes 1-octadecene, oleic acid, trioctylphosphine (TOP) or a combination thereof.

In an embodiment of the invention, the first precursor includes Zn-oleate and Cd-oleate.

In an embodiment of the invention, a temperature of the first heat treatment is 260° C. to 280° C. and a heating time of the first heat treatment is 3 minutes to 10 minutes.

In an embodiment of the invention, a temperature of the second heat treatment is 300° C. to 320° C. and a heating time of the second heat treatment is 5 minutes to 30 minutes.

In an embodiment of the invention, a content of the $Zn(ac)_2$ is 2-15 mmol, a content of the CdO is 0.2-5 mmol, a content of the surfactant is 7-70 mmol, and a content of the solvent is 40-50 mL based on the total amount of the first precursor.

In an embodiment of the invention, a content of the element S is 2-12 mmol, a content of the element Se is 0.1-5.0 mmol, and a content of the TOP is 5-10 mL based on the total amount of the second precursor.

In an embodiment of the invention, each of the gigantic quantum dots includes a core constituted of CdSe, a shell constituted of ZnS, and an alloy configured between the core and the shell. The core is wrapped by the shell. The alloy constituted of Cd, Se, Zn and S, wherein a content of the Cd and Se gradually decreases from the core to the shell and a content of the Zn and S gradually increases from the core to the shell.

In an embodiment of the invention, a particle size of each of the gigantic quantum dots is equal to or more than 10 nm.

In an embodiment of the invention, a diameter of the core is 1 to 4 nm, a sum diameter of the alloy and the core is 5 to 8 nm, and a particle size of each gigantic quantum dot is 10 nm to 15 nm.

In an embodiment of the invention, the gigantic quantum dots are capable of emitting light upon excitation with a photoluminescence quantum efficiency equal to or more than 90%.

In an embodiment of the invention, the gigantic quantum dots are capable of emitting light upon excitation with a photoluminescence quantum efficiency in a range of 90% to 95%.

In an embodiment of the invention, the core of each of the gigantic quantum dots is capable of absorbing a fixed wavelength range of light of a light source and emitting at least one different wavelength range of light.

In an embodiment of the invention, the wavelength of light emitted by the core of each of the gigantic quantum dots decreases with increasing of a content of the surfactant during synthesis.

Based on the above, the invention provides gigantic quantum dots with equal to or more than 10 nm in diameter (or particle size) and a method of forming the same, so as to increase long-term stability of the gigantic quantum dots. In addition, the method is capable of fine-tuning the gigantic quantum dots emission peak wavelength by changing the amount of a surfactant without sacrificing the emission quantum yields as well as full width at half maximum (FWHM) of the corresponding gigantic quantum dots. Therefore, the gigantic quantum dots of the invention are suitable for applying on the display apparatus (e.g., light emitting diode (LED) device or a projector color wheel) with intense light, high temperature, etc.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
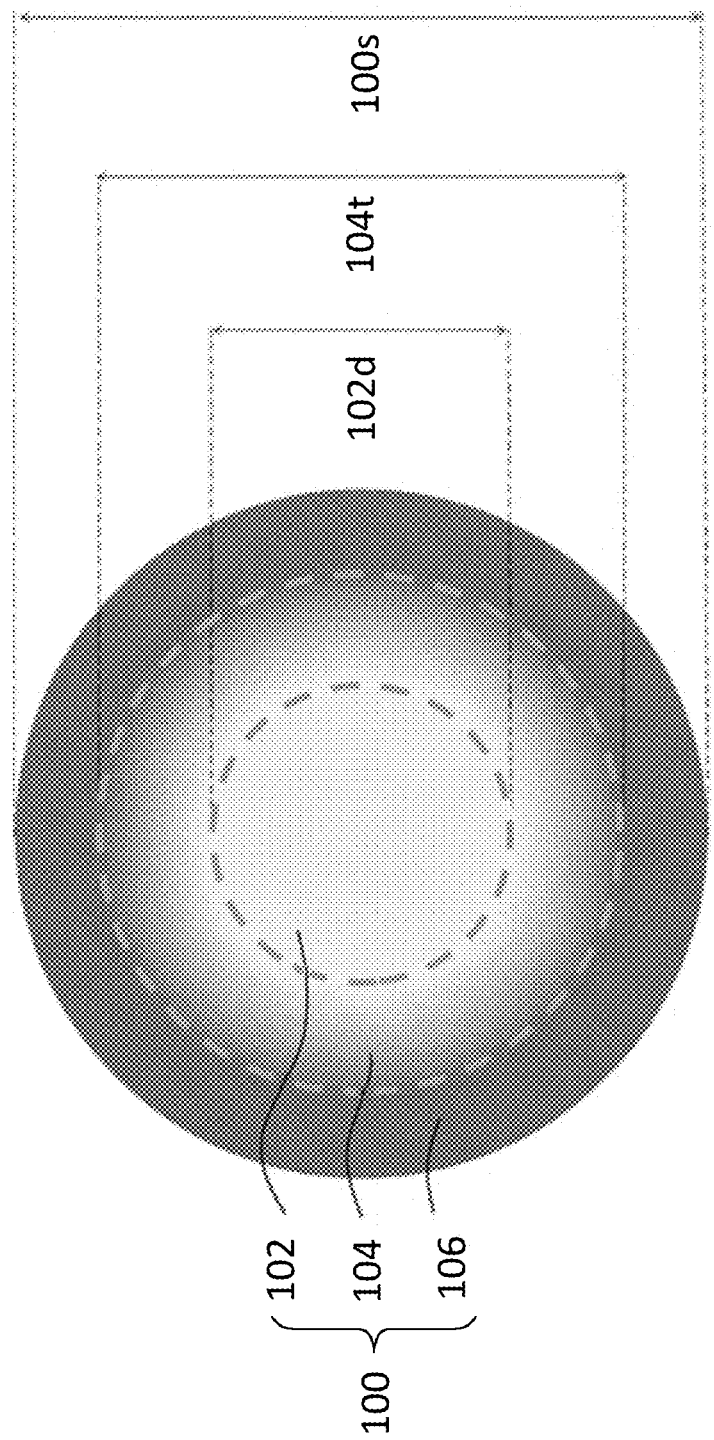
FIG. 1 is a schematic drawing illustrating gigantic quantum dots according to an embodiment of the invention.

Hereinafter, the invention is illustrated more comprehensively referring to the drawings. However, the invention may be embodied in many different forms and should not be construed as limited to the embodiments set forth herein. Thicknesses of layers and regions in the drawings may be enlarged for clarity. The same or similar reference numbers represent the same or similar components, and are not repeated again in the following paragraphs.

In the present specification, ranges represented by "a numerical value to another numerical value" are schematic representations to avoid listing all of the numerical values in the range in the specification. Therefore, the recitation of a specific numerical range discloses any numerical value in the numerical range and a smaller numerical range defined by any numerical value in the numerical range, as is the case with any numerical value and a smaller numerical range stated expressly in the specification. For instance, the range of "a particle size of 10 nm to 15 nm" discloses the range of "a particle size of 11 nm to 13 nm", regardless of whether other numerical values are listed in the specification.

FIG. 1 is a schematic drawing illustrating gigantic quantum dots according to an embodiment of the invention.

Referring to FIG. 1, the gigantic quantum dot 100 includes a core 102 constituted of CdSe, a shell 106 constituted of ZnS, and an alloy 104 configured between the core 102 and the shell 106. The core 102 is wrapped by the shell 106. The alloy 104 constituted of Cd, Se, Zn and S. Specifically, a content of the Cd and Se of the alloy 104 gradually decreases from the core 102 to the shell 106 and a content of the Zn and S of the alloy 104 gradually increases from the core 102 to the shell 106.

In some embodiments, a diameter 102d of the core 102 is 1 to 4 nm and a total diameter of 104t of the alloy 104 and core 102 is 5 to 8 nm. In some embodiments, a particle size 100s of the gigantic quantum dot 100 is equal to or more than 10 nm. In alternative embodiments, a particle size 100s of the gigantic quantum dot 100 is 10 nm to 15 nm. The core 102 of the gigantic quantum dot 100 is used for absorption and emission. In some embodiments, the core 102 of the gigantic quantum dot 100 is capable of absorbing a fixed wavelength range of light of a light source and emitting at least one different wavelength range of light. For example, the core 102 is capable of absorbing in an UV light with the wavelength less than 400 nm and emitting a visible light with different colors (e.g., red light, green light or blue light) depending on the particle size 102d of the core 102. The shell 106 of the gigantic quantum dot 100 is used for protection the core 102. The thick shell 106 provides good protection which leads to higher long-term stability. The alloy 104 configured between the core 102 and the shell 106 minimizes the effect of lattice mismatch between the core 102 and the shell 106.

It should be noted that the gigantic quantum dots 100 are capable of emitting light upon excitation with a photoluminescence quantum efficiency equal to or more than 90%, which means the core 102 of the gigantic quantum dots 100 has good quality and very few defects. In other words, the gigantic quantum dots 100 of the present invention is able to increase long-term stability while remaining the high emission quantum yield. Therefore, the gigantic quantum dots 100 of the present invention are suitable for applying on the display apparatus (e.g., light emitting diode (LED) device or a projector color wheel) with intense light, high temperature, etc. In alternative embodiments, the gigantic quantum dots 100 are capable of emitting light upon excitation with a photoluminescence quantum efficiency in a range of 90% to 95%.

Figure 2:
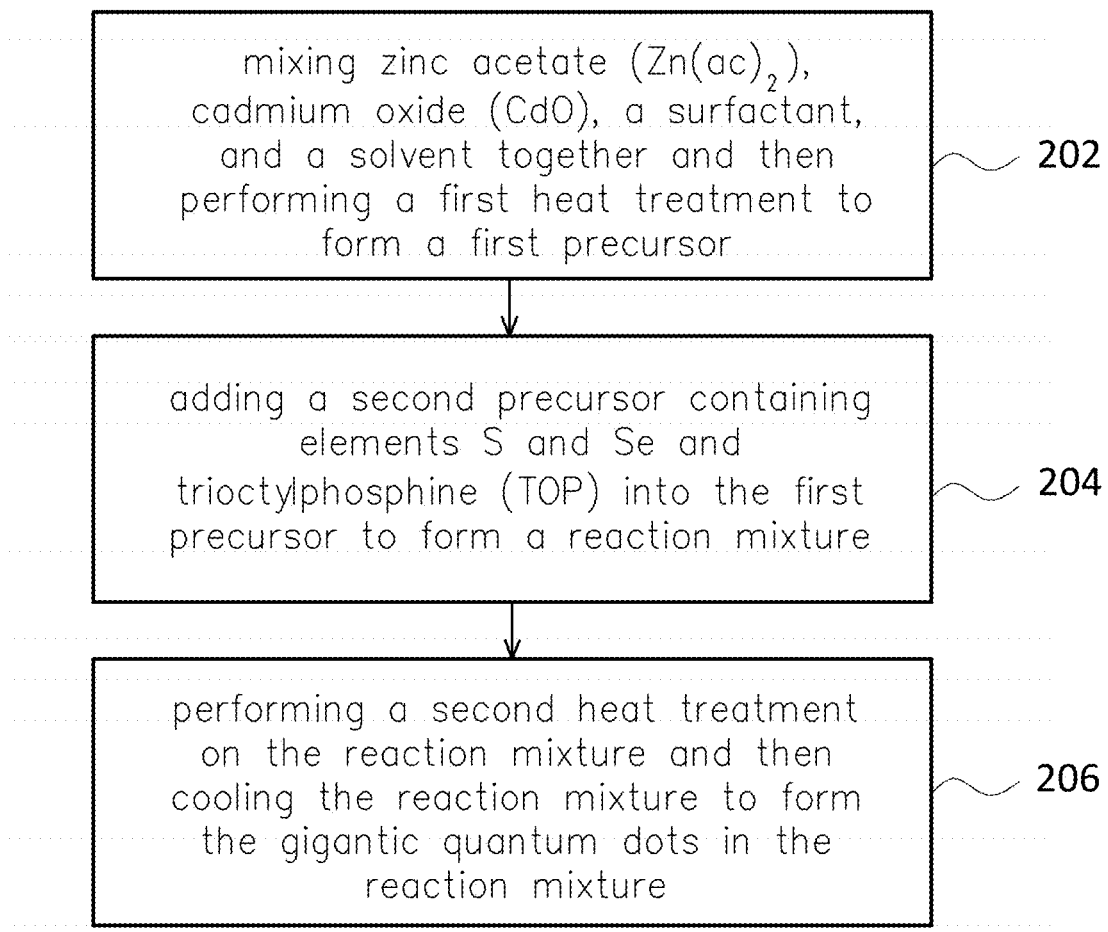
FIG. 2 is a flow-chat drawing illustrating a manufacturing flow of the gigantic quantum dots according to the embodiment of the invention.

FIG. 2 is a flow-chat drawing illustrating a manufacturing flow of the gigantic quantum dots according to the embodiment of the invention.

Referring to FIG. 2, a method 200 for manufacturing the gigantic quantum dots 100 of FIG. 1 is as follows. First, a step 202 is performed. Zinc acetate ($Zn(ac)_2$), cadmium oxide (CdO), a surfactant, and a solvent are mixed together and then a first heat treatment is performed to form a first precursor. In some embodiments, a content of the $Zn(ac)_2$ is 2-15 mmol, a content of the CdO is 0.2-5 mmol, a content of the surfactant is 7-70 mmol, and a content of the solvent is 40 to 50 mL based on the total amount of the first precursor. In some embodiments, a temperature of the first heat treatment is 260° C. to 280° C. and a heating time of the first heat treatment is 3 minutes to 10 minutes.

After the first heat treatment, the first precursor may include Zn-complex with the surfactant and Cd-complex with the surfactant. Specifically, Cd and Zn metal precursor starts to complex with ligands of the surfactant (e.g., oleic acid) at 260° C.-280° C. It should be noted that the formation of metal-ligand complex (e.g., Zn-oleate and Cd-oleate) will decrease the nucleation rate of nanocrystals, thus decreasing the concentration of seed crystals per unit time during the reaction. Since less seed crystals are formed, there will be more remaining metal-ligand complex available to bind with the seed crystals during the growth stage. The quantum dots are thus able to grow larger. That is, this provides slower, more controllable growth, so as to form the quantum dots with less defects. This would also facilitate the formation of gradient alloy intermediate layer and allows the quantum dots to grow to a size equal to or greater than 10 nm in diameter. In some embodiments, the surfactant may include oleic acid, trioctylphosphine (TOP) or a combination thereof. In some embodiments, the solvent may include 1-octadecene, oleic acid, trioctylphosphine (TOP) or a combination thereof.

Next, a step 204 is performed. A second precursor containing elements S, Se and trioctylphosphine (TOP) is added into the first precursor to form a reaction mixture. In some embodiments, a content of the element S is 2-12 mmol, a content of the element Se is 0.1-5.0 mmol, and a content of the TOP is 5 to 10 mL based on the total amount of the second precursor.

A step 206 is then performed. A second heat treatment is performed on the reaction mixture and then cooling the reaction mixture to form the gigantic quantum dots in the reaction mixture. In some embodiments, a temperature of the second heat treatment is 300° C. to 320° C. and a heating time of the second heat treatment is 5 minutes to 30 minutes.

In order to improve reliability of the invention, the following lists several examples to illustrate the gigantic quantum dots 100 of the invention further. Although the following experiments are described, the material used and the amount and ratio of each thereof, as well as handling details and handling procedures, etc., can be suitably modified without exceeding the scope of the invention. Accordingly, restrictive interpretation should not be made to the invention based on the embodiments described below.

Example 1

12 mmol of Zn(ac)$_2$, 0.864 mmol of CdO, 47.5 mmol of oleic acid (OA) and 45 mL of 1-octadecene (ODE) were added into a 100 mL flask under 1 atm at 260° C. to form a clear precursor solution. The clear precursor solution includes Zn-oleate and Cd-oleate. After the surfactant-metal complexes (i.e., Zn-oleate and Cd-oleate) were formed, the flask was filled with Ar or N$_2$ and heated up to 310° C. When reaching the desired temperature, 6 mL of trioctylphosphine (TOP) containing 10.68 mmol Sulfur and 0.3 mmol Selenium was quickly injected into the flask. The reaction temperature was maintained at 300° C. for 10 minutes, then the reaction was cooled down to room temperature. The gigantic quantum dots (QDs) with equal to or more than 10 nm in diameter (or particle size) were formed. The photoluminescence (PL) emission peak of the gigantic QDs is 530 nm (i.e., green light) by irradiating of an ultraviolet light (e.g., 405 nm). The emission quantum yield of the QDs was 93%. The results are as shown in Table 1 and FIG. 3.

Examples 2-7

The manufacturing steps of forming gigantic QDs of Examples 2-7 are similar to the above manufacturing steps of Example 1. The difference between Examples 1-7 is that a content of the surfactant (i.e., OA) adding into the precursor solution which shown as Table 1. The PL emission peak and emission quantum yield of Examples 2-7 are also shown in Table 1 and FIG. 3.

TABLE 1

| Example | OA (mmol) | Wavelength (nm) | FWHM (nm) | QY (%) |
|---|---|---|---|---|
| 1 | 47.50 | 530 | 33 | 93 |
| 2 | 17.45 | 610 | 31 | 90 |
| 3 | 30.08 | 560 | 36 | 92 |
| 4 | 41.19 | 550 | 33 | 91 |
| 5 | 44.36 | 540 | 34 | 92 |
| 6 | 57.03 | 520 | 29 | 95 |
| 7 | 63.35 | 480 | 28 | 91 |

Figure 4:
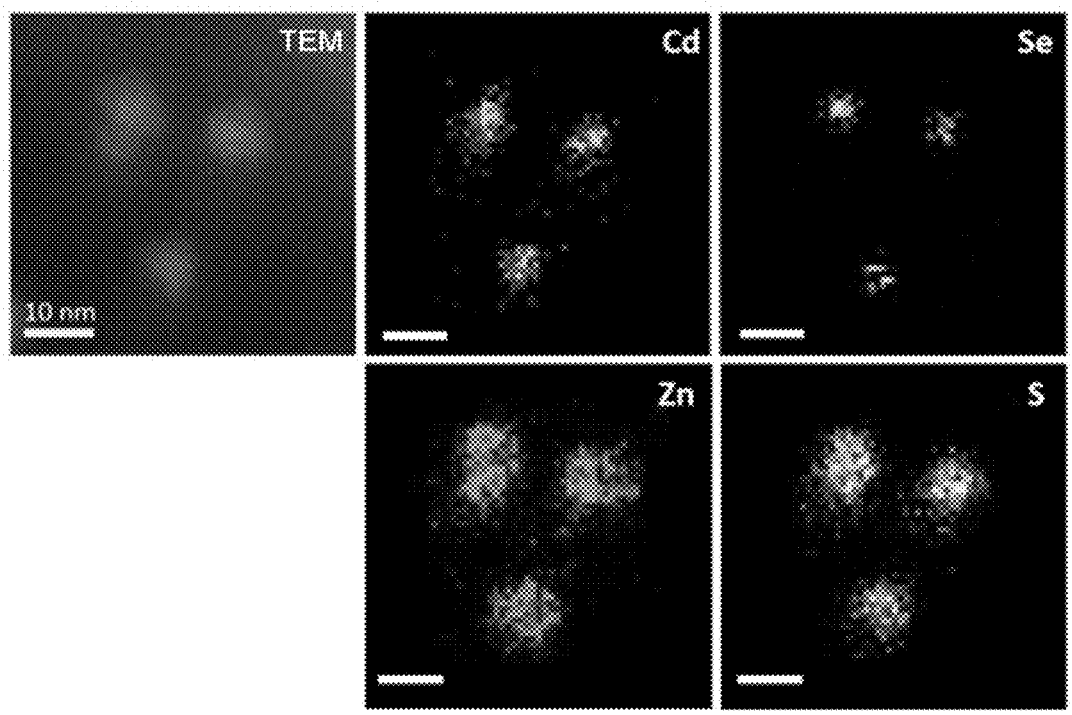
FIG. 4 is a transmission electron microscope (TEM) image and high angle annular dark field scanning transmission electron microscopy (HAADF-STEM) images of quantum dots from Example 1.
Figure 5:
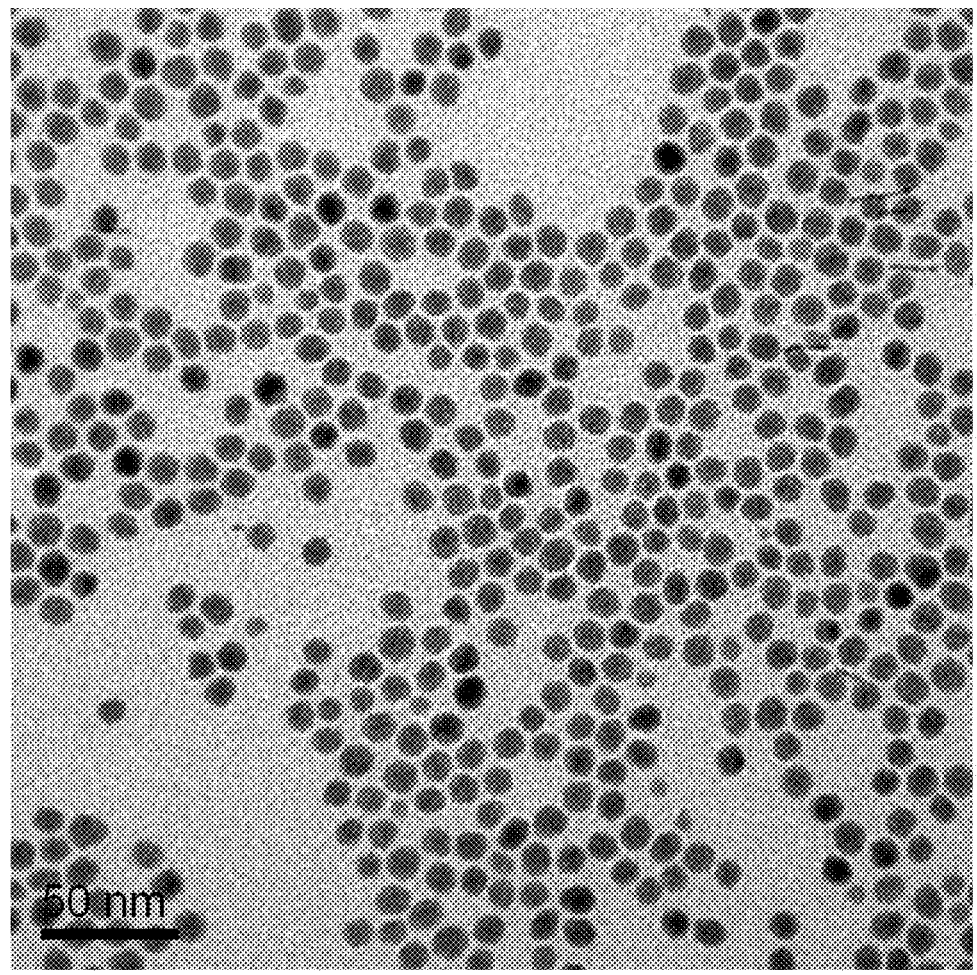
FIG. 5 is a transmission electron microscope (TEM) image of quantum dots from Example 2.

FIG. 4 is a transmission electron microscope (TEM) image and high angle annular dark field scanning transmission electron microscopy (HAADF-STEM) image of quantum dots from Example 1. FIG. 5 is a transmission electron microscope (TEM) image of quantum dots from Example 2.

As shown in FIG. 5, quantum dots synthesized from Example 2 were observed under transmission electron microscope (TEM). The size of quantum dots is determined to be approximately 15 nm.

In addition, the size of the quantum dots and peak emission wavelength can be tuned by altering the content of the surfactant (e.g., oleic acid). As shown in FIG. 4, the mean diameter of the quantum dots was determined to be 11 nm from the TEM image (see the subfigure in the upper left corner). From the HAADF-STEM images, it was clear that the quantum dots have a core constituted of CdSe, a shell constituted of ZnS, and an alloy configured between the core and the shell. It was also possible to determine the size of the core and alloy layer based on the distribution of each element in the quantum dots from the HAADF-STEM images. As shown in FIG. 4, Se was mainly situated at the core, therefore the mean diameter of the core was determined to be less than 3.7 nm by measuring the distribution of Se. The alloy layer of the quantum dots contained Cd, Se, Zn and S. The mean diameter of the core and alloy layers was determined to be 7.0 nm by measuring the distribution of Cd. Zn and S were distributed throughout the shell and alloy layer, and the size of the quantum dot was determined to be 11 nm from the distribution of Zn and S.

Figure 3:
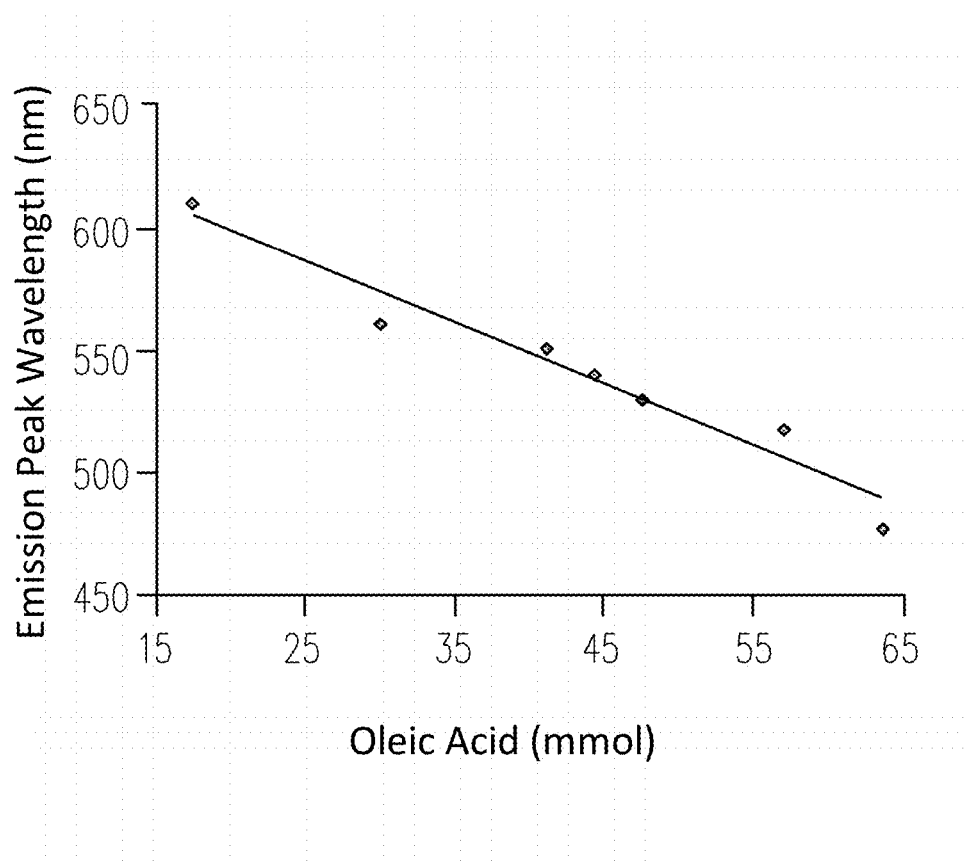
FIG. 3 is a diagram illustrating the relationship between emission peak wavelength and amount of oleic acid of Examples 1-7.

FIG. 3 is a diagram illustrating the relationship between emission peak wavelength and amount of oleic acid of Examples 1-7.

As shown in Table 1 and FIG. 3, the wavelength of light emitted by the gigantic QDs decreases with increasing of the content of the surfactant (e.g., OA). Specifically, Zn is the main component of the shell layer of the QD. Additionally, Zn in the shell layer can migrate towards the edge of the quantum dot photoluminescence center (the main component is CdSe) during reaction at high temperature (>300° C.). The increase in OA concentration would increase the concentration of Zn-oleate complex, then increase the Zn content in the shell, and ultimately leads to an increase in the amount of Zn available during the growth stage. Since more Zn is incorporated into the shell layer, there are more Zn atoms available to migrate towards the edge of quantum dot photoluminescence center to form a Zn-rich alloy structure, thus increasing the band gap of the quantum dots. A larger band gap leads to a shorter emission peak wavelength of quantum dots. That is, the emission peak wavelength can be easily tuned to the desired wavelength by changing the content of OA without sacrificing the emission quantum yields as well as full width at half maximum (FWHM) of the corresponding gigantic QDs.

Based on the above, the invention provides gigantic quantum dots with equal to or more than 10 nm in diameter (or particle size) and a method of forming the same, so as to increase long-term stability of the gigantic quantum dots. In addition, the method is capable of fine-tuning the gigantic quantum dots emission peak wavelength by changing the amount of a surfactant without sacrificing the emission quantum yields as well as full width at half maximum (FWHM) of the corresponding gigantic quantum dots. Therefore, the gigantic quantum dots of the invention are suitable for applying on the display apparatus (e.g., light emitting diode (LED) device or a projector color wheel) with intense light, high temperature, etc.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming gigantic quantum dots comprising:
   providing a first precursor by mixing zinc acetate (Zn(ac)$_2$), cadmium oxide (CdO), a surfactant, and a solvent together and then performing a first heat treatment, wherein the first precursor comprises Zn-complex having the surfactant and Cd-complex having the surfactant;

adding a second precursor containing elements S and Se and trioctylphosphine (TOP) into the first precursor to form a reaction mixture; and performing a second heat treatment on the reaction mixture and then cooling the reaction mixture to form the gigantic quantum dots in the reaction mixture, wherein each of the gigantic quantum dots comprises:

a core constituted of CdSe;

a shell constituted of ZnS and wrapping a surface of the core; and an alloy configured between the core and the shell, the alloy constituted of Cd, Se, Zn and S, wherein a content of the Cd and Se gradually decreases from the core to the shell, and a content of the Zn and S gradually increases from the core to the shell.

2. The method according to claim 1, wherein the surfactant comprises oleic acid, trioctylphosphine (TOP) or a combination thereof, and the solvent comprises 1-octadecene, oleic acid, trioctylphosphine (TOP) or a combination thereof.

3. The method according to claim 2, wherein the first precursor comprises Zn-oleate and Cd-oleate.

4. The method according to claim 1, wherein a temperature of the first heat treatment is 260° C. to 280° C. and a heating time of the first heat treatment is 3 minutes to 10 minutes.

5. The method according to claim 1, wherein a temperature of the second heat treatment is 300° C. to 320° C. and a heating time of the second heat treatment is 5 minutes to 30 minutes.

6. The method according to claim 1, wherein a content of the $Zn(ac)_2$ is 2-15 mmol, a content of the CdO is 0.2-5 mmol, a content of the surfactant is 7-70 mmol, and a content of the solvent is 40-50 mL based on the total amount of the first precursor.

7. The method according to claim 1, wherein a content of the element S is 2-12 mmol, a content of the element Se is 0.1-5.0 mmol, and a content of the TOP is 5-10 mL based on the total amount of the second precursor.

8. The method according to claim 1, wherein a particle size of each of the gigantic quantum dots is equal to or more than 10 nm.

9. The method according to claim 1, wherein a diameter of the core is 1 to 4 nm, a sum diameter of the alloy and the core is 5 to 8 nm, and a particle size of each of the gigantic quantum dots is 10 nm to 15 nm.

10. The method according to claim 1, wherein the gigantic quantum dots are capable of emitting light upon excitation with a photoluminescence quantum efficiency equal to or more than 90%.

11. The method according to claim 1, wherein the gigantic quantum dots are capable of emitting light upon excitation with a photoluminescence quantum efficiency in a range of 90% to 95%.

12. The method according to claim 1, wherein the core of each of the gigantic quantum dots is capable of absorbing a fixed wavelength range of light of a light source and emitting at least one different wavelength range of light.

13. The method according to claim 1, wherein the wavelength of light emitted by the core of each of the gigantic quantum dots decreases with increasing of a content of the surfactant during synthesis.

* * * * *